United States Patent
Hirmer et al.

(10) Patent No.: US 11,289,534 B2
(45) Date of Patent: Mar. 29, 2022

(54) COMPONENT HAVING SEMICONDUCTOR BODIES ELECTRICALLY CONDUCTIVELY CONNECTED VIA A TRANSITION ZONE

(71) Applicant: OSRAM OLED GmbH, Regensburg (DE)

(72) Inventors: Marika Hirmer, Wiesent (DE); Sophia Huppmann, Geldersheim (DE); Simeon Katz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 322 days.

(21) Appl. No.: 16/316,166

(22) PCT Filed: May 26, 2017

(86) PCT No.: PCT/EP2017/062783
§ 371 (c)(1),
(2) Date: Jan. 8, 2019

(87) PCT Pub. No.: WO2018/010883
PCT Pub. Date: Jan. 18, 2018

(65) Prior Publication Data
US 2020/0350359 A1    Nov. 5, 2020

(30) Foreign Application Priority Data
Jul. 14, 2016   (DE) .................... 10 2016 113 002.8

(51) Int. Cl.
*H01L 33/22* (2010.01)
*H01L 27/15* (2006.01)
(Continued)

(52) U.S. Cl.
CPC .......... *H01L 27/15* (2013.01); *H01L 33/0093* (2020.05); *H01L 33/22* (2013.01);
(Continued)

(58) Field of Classification Search
None
See application file for complete search history.

(56) References Cited

U.S. PATENT DOCUMENTS 5,458,694 A * 10/1995 Nuyen .................. H01L 31/043
                                                    136/249
6,593,522 B2 * 7/2003 Nakano ............... H01L 31/0392
                                                    136/246
(Continued)

FOREIGN PATENT DOCUMENTS

CN    102280548 A    12/2011
CN    102347344 A    2/2012
(Continued)

OTHER PUBLICATIONS

Notice of Reasons for Refusal dated Aug. 11, 2020, of counterpart Japanese Application No. 2018-566955, along with an English translation.
(Continued)

*Primary Examiner* — Bilkis Jahan
(74) *Attorney, Agent, or Firm* — DLA Piper LLP (US)

(57) ABSTRACT

A component includes a substrate, a first semiconductor body having a first active layer, a second semiconductor body having a second active layer, and a first transition zone, wherein the first active layer is configured to generate electromagnetic radiation of a first peak wavelength and the second active layer is configured to generate electromagnetic radiation of a second peak wavelength, in the vertical direction, the first transition zone is arranged between the first and second semiconductor bodies and is directly adjacent to the first and second semiconductor bodies, the first transition zone includes a radiation-transmissive, at least for the radiation of the first peak wavelength partially transparent and electrically conductive material so that the first semiconductor body electrically conductively connects to
(Continued)

the second semiconductor body via the first transition zone, and the first transition zone includes a structured surface or a first partially transparent and partially wavelength-selectively reflective mirror structure.

14 Claims, 8 Drawing Sheets

(51) Int. Cl.
  *H01L 33/00* (2010.01)
  *H01L 33/42* (2010.01)
  *H01L 33/46* (2010.01)
(52) U.S. Cl.
  CPC ............ *H01L 33/42* (2013.01); *H01L 33/46* (2013.01); *H01L 2933/0016* (2013.01); *H01L 2933/0025* (2013.01); *H01L 2933/0091* (2013.01)

(56) References Cited

U.S. PATENT DOCUMENTS

| | | | |
|---|---|---|---|
| 2005/0067627 A1 | 3/2005 | Shen et al. | |
| 2006/0267026 A1 | 11/2006 | Kim et al. | |
| 2007/0040162 A1 | 2/2007 | Song | |
| 2007/0284607 A1 | 12/2007 | Epler et al. | |
| 2008/0179606 A1 | 7/2008 | Usuda et al. | |
| 2008/0190479 A1* | 8/2008 | Hsieh | H01L 31/0725 136/246 |
| 2008/0258133 A1 | 10/2008 | Seong | |
| 2009/0078954 A1 | 3/2009 | Shim et al. | |
| 2009/0309120 A1 | 12/2009 | Heidborn et al. | |
| 2010/0221897 A1 | 9/2010 | Seong | |
| 2010/0295075 A1 | 11/2010 | Smith et al. | |
| 2011/0175121 A1 | 7/2011 | Gmeinwieser et al. | |
| 2011/0227124 A1 | 9/2011 | Heidborn et al. | |
| 2012/0025237 A1* | 2/2012 | Lai | H01L 25/0756 257/98 |
| 2012/0094414 A1 | 4/2012 | Or-Bach et al. | |
| 2013/0170011 A1* | 7/2013 | Cho | G02F 1/017 359/263 |
| 2013/0175500 A1* | 7/2013 | Cho | H01L 31/035236 257/21 |
| 2013/0270514 A1* | 10/2013 | Saxler | H01L 33/08 257/13 |

FOREIGN PATENT DOCUMENTS

| | | |
|---|---|---|
| CN | 204144308 U | 2/2015 |
| DE | 199 53 588 A1 | 8/2000 |
| DE | 10 2009 020 127 A1 | 9/2010 |
| DE | 11 2009 002 311 T5 | 1/2012 |
| DE | 10 2013 104 954 A1 | 11/2014 |
| JP | H07-254732 A | 10/1995 |
| JP | 2005-259970 A | 9/2005 |
| JP | 2007-53383 A | 3/2007 |
| JP | 2007-335879 A | 12/2007 |
| JP | 2008-182110 A | 8/2008 |
| JP | 2009-514209 A | 4/2009 |
| JP | 2009-158696 A | 7/2009 |
| JP | 2010-45065 A | 2/2010 |
| JP | 2010-505244 A | 2/2010 |
| JP | 2011-511446 A | 4/2011 |
| JP | 2011-138875 A | 7/2011 |
| WO | 2017/153123 A1 | 9/2017 |

OTHER PUBLICATIONS

Notice of Reasons for Rejection dated Feb. 4, 2020, of counterpart Japanese Application No. 2018-566955, along with an English translation.
The First Office Action dated Sep. 22, 2020, of counterpart Chinese Application No. 201780043616.9, along with an English translation.
The Second Office Action dated Aug. 18, 2021, counterpart of Chinese Application No. 201780043616.9, along with an English translation.

* cited by examiner

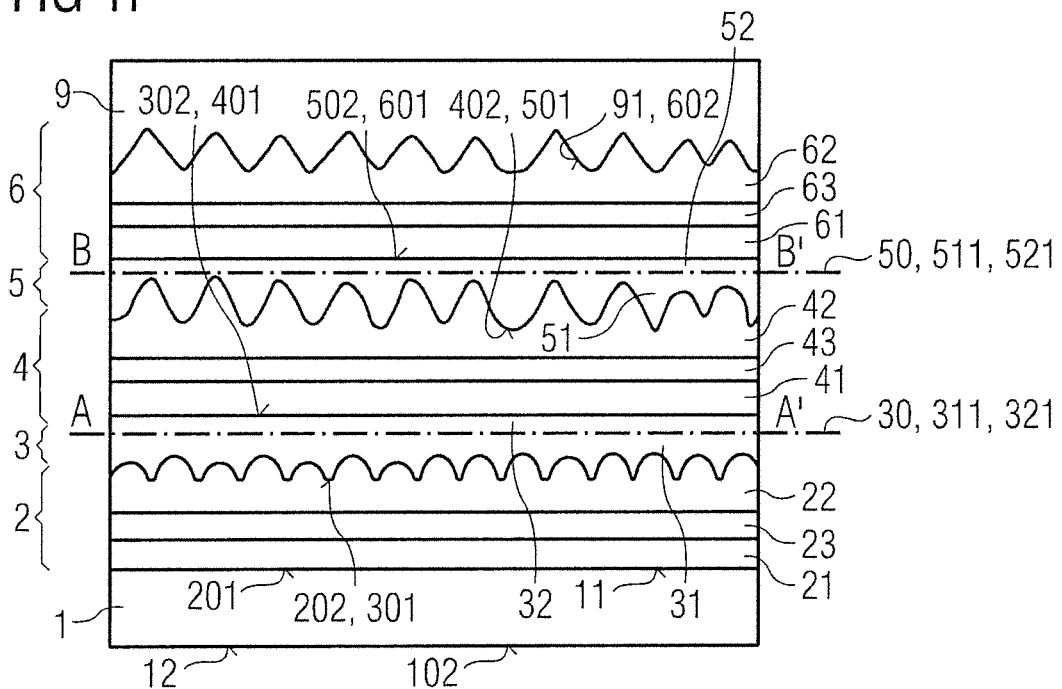
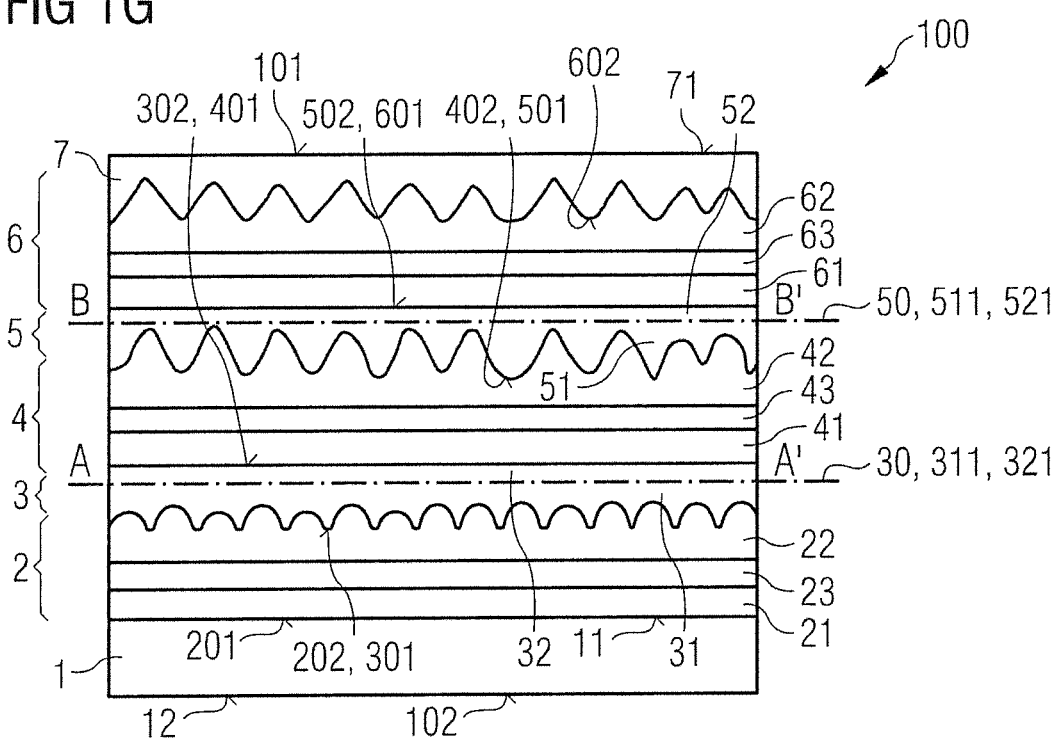

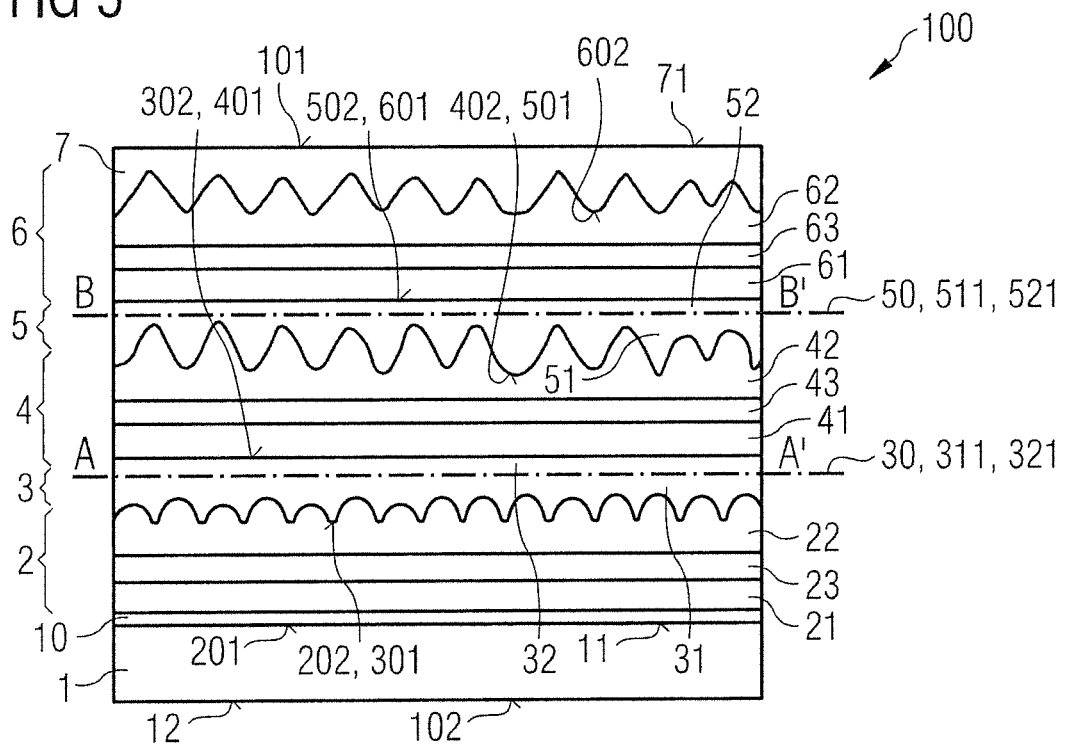
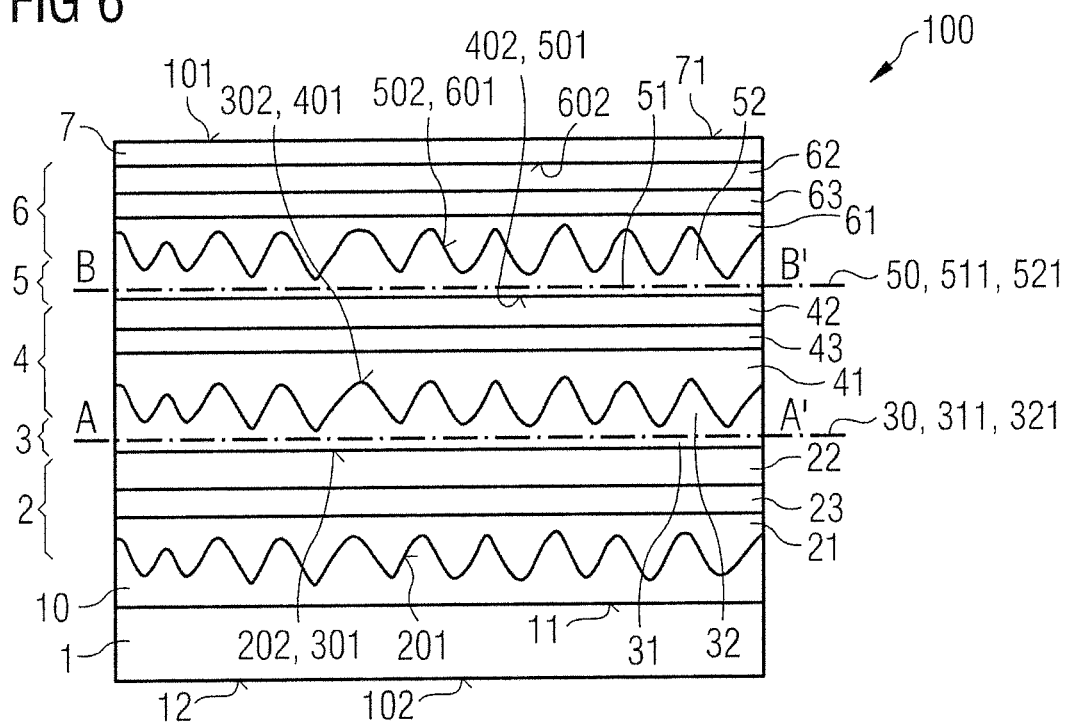

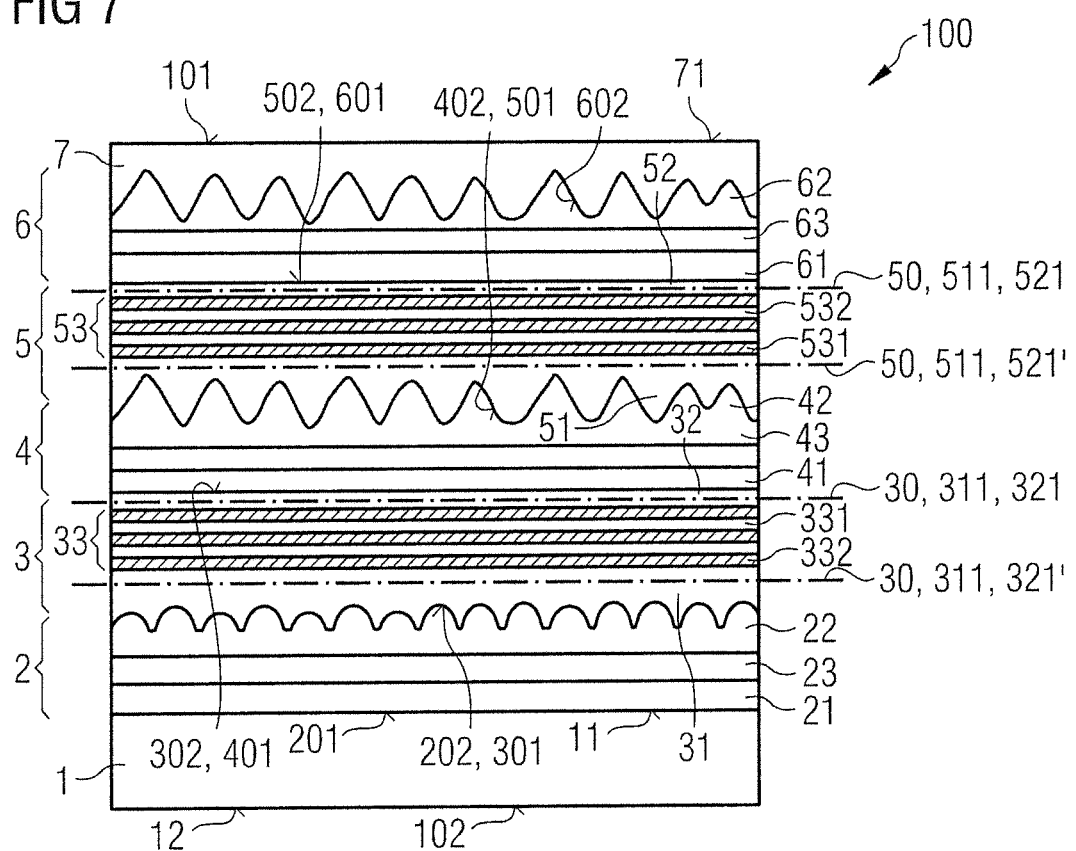

COMPONENT HAVING SEMICONDUCTOR BODIES ELECTRICALLY CONDUCTIVELY CONNECTED VIA A TRANSITION ZONE

TECHNICAL FIELD

This disclosure relates to a component, in particular an optoelectronic component, having improved efficiency and a method of producing a component.

BACKGROUND

In a component comprising stacked semiconductor bodies, each of which has an optically active layer that generates electromagnetic radiation of a specific peak wavelength, emitted light of different wavelengths propagates in all directions. Absorption occurs when emitted light of a first wavelength enters semiconductor bodies that emit light of further wavelengths. Especially at interfaces between the semiconductor bodies, light losses occur due to reflections or total reflections.

To increase the efficiency of the component, a mirror is often used to prevent light from being emitted for instance towards the direction of a carrier of the component. Such a mirror is usually not transmissive to visible light and can therefore only be arranged at one end of the component. In that example, the light emitted by the semiconductor bodies, which impinges on the mirror and is reflected back, has to penetrate through all the semiconductor bodies of the component so that it is partially absorbed before it can be decoupled from the component.

There is thus a need to increase the efficiency of a component, in particular of a component having stacked semiconductor bodies and to provide a simplified and reliable method of producing a component.

SUMMARY

We provide a component including a substrate, a first semiconductor body having a first active layer, a second semiconductor body having a second active layer, and a first transition zone, wherein the first active layer is configured to generate electromagnetic radiation of a first peak wavelength and the second active layer is configured to generate electromagnetic radiation of a second peak wavelength, in the vertical direction, the first transition zone is arranged between the first semiconductor body and the second semiconductor body and is directly adjacent to the first semiconductor body and directly adjacent to the second semiconductor body, the first transition zone includes a radiation-transmissive, at least for the radiation of the first peak wavelength partially transparent and electrically conductive material so that the first semiconductor body electrically conductively connects to the second semiconductor body via the first transition zone, and the first transition zone includes a structured main surface or a first partially transparent and partially wavelength-selectively reflective mirror structure.

We also provide a method of producing a component including A) providing a first composite including a substrate, a first semiconductor body and a first terminal layer, wherein the first composite has a first exposed planar connecting surface formed by a surface of the first terminal layer, and the first semiconductor body is arranged between the substrate and the first planar connecting surface and includes a first optically active layer; B) providing a second composite including an auxiliary substrate, a second semiconductor body and a second terminal layer, wherein the second composite includes a second exposed planar connecting surface formed by a surface of the second terminal layer, the second semiconductor body is arranged between the auxiliary substrate and the second planar connecting surface and includes a second optically active layer; and the first terminal layer and the second terminal layer each include a radiation-transmissive and electrically conductive material; C) mechanically and electrically connecting the first composite to the second composite at the first and second planar connecting surfaces by direct bonding to form a transition zone, wherein the transition zone includes the first and the second terminal layers and has a structured main surface or a partially transparent and partially wavelength-selectively reflective mirror structure; and D) separating the auxiliary substrate from the second composite.

We further provide a component including a substrate, a first semiconductor body having a first active layer, a second semiconductor body having a second active layer, and a first transition zone, wherein the first active layer is configured to generate electromagnetic radiation of a first peak wavelength and the second active layer is configured to generate electromagnetic radiation of a second peak wavelength, in the vertical direction, the first transition zone is arranged between the first semiconductor body and the second semiconductor body and is directly adjacent to the first semiconductor body and directly adjacent to the second semiconductor body, the first transition zone includes a radiation-transmissive, at least for the radiation of the first peak wavelength partially transparent and electrically conductive material so that the first semiconductor body is electrically conductively connected to the second semiconductor body via the first transition zone, and i.) the first transition zone includes a structured main surface being a common structured interface between a structured main surface of a first terminal layer of the first transition zone and a structured main surface of the first semiconductor body facing away from the substrate, and the main surface of first terminal layer faces the first semiconductor body and has an inverted structure of the main surface of the first semiconductor body; or ii.) the first transition zone includes a first partially transparent and partially wavelength-selectively reflective mirror structure, the first mirror structure includes alternately disposed first layers and second layers, the first mirror structure has a plurality of through-contacts extending vertically throughout the first layers and the second layers, and the through-contacts are formed from an electrically conductive material.

BRIEF DESCRIPTION OF THE DRAWINGS

FIGS. 1A, 1B, 1C, 1D, 1E, 1F and 1G show schematic illustrations of different method steps of producing a component according to a first example.

FIG. 5 shows a schematic illustration of a component according to a first example in a sectional view.

FIGS. 6 and 7 show further examples of a component in schematic sectional views.

LIST OF CHARACTER SIGNS

Figure 1A:
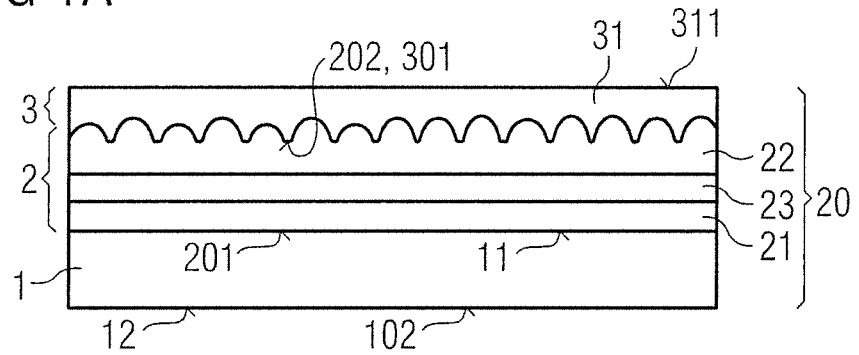

100 Component
101 Front side of component

102 Rear side of the component
1 Substrate/Carrier
10 Intermediate layer
11 First main surface of the substrate
12 Second main surface of the substrate
2 First semiconductor body
20 First composite
201 First main surface of the first semiconductor body
202 Second main surface of the first semiconductor body
21 First semiconductor layer of the first semiconductor body
22 Second semiconductor layer of the first semiconductor body
23 First active layer
3 First transition zone
30 Inner interface surface of the first transition zone
301 First main surface of the first transition zone
302 Second main surface of the first transition zone
31 First terminal layer of the first transition zone
311 First connecting surface
32 Second terminal layer of the first transition zone
321 Second connecting surface
321' Connecting surface of the mirror structure
33 First mirror structure
34 Through-contacts
331 First layer of the first mirror structure
332 Second layer of the first mirror structure
4 Second semiconductor body
40 Second composite
401 First main surface of the second semiconductor body
402 Second main surface of the second semiconductor body
41 First semiconductor layer of the second semiconductor body
411 First connecting surface
42 Second semiconductor layer of the second semiconductor body
421 Second connecting surface
43 Second active layer
5 Second transition zone
50 Inner interface surface of the second transition zone
501 First main surface of the second transition zone
502 Second main surface of the second transition zone
51 First terminal layer of the second transition zone
511 Further first connecting surface
52 Second terminal layer of the second transition zone
521 Further second connecting surface
53 Second mirror structure
531 First layer of the second mirror structure
532 Second layer of the second mirror structure
6 Third semiconductor body
50 Third composite
601 First main surface of the third semiconductor body
602 Second main surface of the third semiconductor body
61 First semiconductor layer of the third semiconductor body
62 Second semiconductor layer of the third semiconductor body
63 Third active layer
7 Cover layer/Contact layer
71 Main surface of the cover layer/contact layer
9 Auxiliary substrate
91 Main surface of the auxiliary substrate

DETAILED DESCRIPTION

Our component may comprise a substrate, a first semiconductor body having a first active layer, a second semiconductor body having a second active layer, and a first transition zone. During operation of the component, the first active layer is configured to generate electromagnetic radiation of a first peak wavelength and the second active layer is configured to generate electromagnetic radiation of a second peak wavelength. The first peak wavelength and the second peak wavelength may be substantially the same or differ from each other by at least 30 nm, for instance by at least 50 nm or by at least 70 nm. The first transition zone is arranged vertically between the first semiconductor body and the second semiconductor body. In particular, the first transition zone is directly adjacent to the first semiconductor body and directly adjacent to the second semiconductor body. The first transition zone has a radiation-transmissive material that is electrically conductive and, at least for the radiation of the first peak wavelength, partially transparent. The first semiconductor body connects to the second semiconductor body preferably via the first transition zone, for example, via the radiation-transmissive and electrically conductive material of the first transition zone. The first transition zone preferably has a structured main surface and/or a first partially transparent and partially wavelength-selectively reflective mirror structure.

A lateral direction is generally understood to mean a direction running along, in particular parallel to, a main extension plane of the component or the first semiconductor body. A vertical direction, on the other hand, means a direction directed transverse, in particular perpendicular, to the main extension plane of the component or the semiconductor body. The vertical direction is for instance a growth direction of the first semiconductor body. The vertical direction and the lateral direction are especially perpendicular to each other.

A main surface of a layer generally means a surface of this layer running along a main extension plane of the layer and in particular delimits this layer from its surroundings, for example, from its neighboring layers. A structured surface generally means a surface that is not smooth but has structures that scatter light especially in the visible wavelength range.

The first transition zone may have a structured main surface. The main surface can face towards or away from the substrate or from the first semiconductor body. In particular, the main surface of the transition zone is a common interface between the transition zone and the first semiconductor body or a common interface between the transition zone and the second semiconductor body. The structured main surface of the first transition zone is thus arranged in the vertical direction between the first active layer and the second active layer. The structured main surface can be roughened. In particular, the structured main surface has decoupling structures formed in the form of elevations or depressions on the main surface. Depending on the size of the decoupling structures, the scattering can be more pronounced for certain wavelengths than for others. In general, radiation components having shorter wavelengths are scattered more strongly than radiation components having longer wavelengths. Having an appropriate choice regarding the size of the decoupling structures, long-wave light generated in particular in the first active layer can be transmitted throughout the transition zone towards the direction of the second semiconductor body without any or hardly any losses, while short-wave light generated in particular in the second active layer can be scattered and reflected back at the structured main surface of the first transition zone and decoupled from the component without being absorbed by the first semiconductor body.

The structured main surface of the first transition zone may have decoupling structures. The decoupling structures have a lateral width of for instance 20 nm to 3 µm, in particular 100 nm to 2 µm, or 100 nm to 1 µm. For example, an average lateral width of the decoupling structures is 50 nm to 1 µm, for instance 100 nm to 800 nm, or 200 nm to 600 nm. Preferably, the structured main surface has first decoupling structures, wherein the first decoupling structures have an average lateral width smaller than the first peak wavelength and larger than the second peak wavelength. In this example, the electromagnetic radiation of the first peak wavelength is scattered hardly or not at all at the structured main surface and thus passes through the first transition zone essentially without radiation losses. In contrast, electromagnetic radiation of the second peak wavelength is scattered more strongly at the structured main surface of the transition zone and reflected back. The main surface of the first transition zone thus acts wavelength-selectively with regard to its scattering and/or reflecting properties. In case of doubt, in consideration of the associated refractive index, the first peak wavelength and the second peak wavelength are determined in their respective semiconductor bodies or in the first transition zone.

The first transition zone may have a first partially transparent and partially wavelength-selectively reflective mirror structure. The first mirror structure acts in particular as a distributed Bragg reflector (DBR) or as a dichroic mirror. In particular, the first mirror structure is formed such that it transmits electromagnetic radiation of the first peak wavelength and at least scatters and/or partially reflects electromagnetic radiation of the second peak wavelength. The first mirror structure may have alternating first and second layers. The first layers may be formed from a radiation-transmissive and electrically conductive material, for example, from the same radiation-transmissive and electrically conductive material as that of the first transition zone. The second layers and the first layers preferably have different materials. In particular, the first layers of the mirror structure have a refractive index differing from a refractive index of the second layers of the first mirror structure by at least 0.3, for instance by at least 0.5 or 0.7. Within the first transition zone, the first mirror structure is arranged in particular between terminal layers made of a radiation-transmissive and electrically conductive material. The first mirror structure can be electrically conductive.

The first mirror structure may have a plurality of through-contacts extending vertically through the first layers and the second layers of the first mirror structure. The through-contacts are preferably electrically conductive. They may be formed from a radiation-transmissive and electrically conductive material, for instance from the same radiation-transmissive and electrically conductive material as that of the first transition zone. In this case, the first mirror structure may have dielectric or electrically weakly conductive first and/or second layers.

The component may have a third semiconductor body having a third optically active layer that generates electromagnetic radiation of a third peak wavelength. For example, the second semiconductor body is arranged vertically between the first semiconductor body and the third semiconductor body. The semiconductor bodies are thus stacked on top of each other. Preferably, the component has a second transition zone via which the second semiconductor body mechanically and electrically connects to the third semiconductor body. In particular, the second transition zone directly adjoins the second semiconductor body and directly adjoins the third semiconductor body.

The first transition zone and the second transition zone may have a structurally similar or identical structure. In other words, the second transition zone can have a radiation-transmissive material that is electrically conductive and, at least for the radiation of the second peak wavelength, partially transparent. Furthermore, the second transition zone may have a structured main surface and/or a partially transparent and partially wavelength-selectively reflective second mirror structure. The semiconductor bodies can also have a structurally similar or identical structure, for example, having a first semiconductor layer of a first charge carrier type, a second semiconductor layer of a second charge carrier type and an optically active layer arranged therebetween.

The second transition zone may have a structured main surface comprising second decoupling structures formed in particular as elevations or depressions. Preferably, the decoupling structures have a lateral of for instance 20 nm three 3 µm inclusive, for instance 20 nm to 1 µm, in particular 50 nm to 900. The decoupling structures may have a vertical width of for instance 50 nm to 3 µm inclusive, for instance 50 nm to 2 µm, in particular 50 nm to 900 nm. In particular, the second decoupling structures have an average lateral width or an average vertical height smaller than the average lateral width or the average vertical height of the first decoupling structures. Preferably, the second decoupling structures have an average lateral width smaller than the second and/or first peak wavelengths and larger than the third peak wavelength. In case of doubt, the peak wavelengths in the respective semiconductor bodies or in the second transition zone are measured taking into account the respective refractive indices.

The first peak wavelength may be assigned to a red spectral range of visible light. The second peak wavelength may be assigned for instance to a green spectral range. The third peak wavelength can be assigned to a blue spectral range. Preferably, the second transition zone has a structured main surface comprising second decoupling structures having smaller lateral widths than the first decoupling structures of the structured main surface of the first transition zone.

The second transition zone may have a partially transparent and partially wavelength-selectively reflective second mirror structure that transmits the electromagnetic radiation of first and second peak wavelengths and scatters and/or at least partially reflects the electromagnetic radiation of the third peak wavelength. Analogous to the first mirror structure, the second mirror structure can be a Bragg mirror, in particular a dichroic mirror, or act as a Bragg mirror or a dichroic mirror.

The first mirror structure and the second mirror structure may differ from each other with respect to their wavelength selectivity. In particular, the first mirror structure is adapted to the radiation of the first peak wavelength and the second mirror structure is adapted to the radiation of the second peak wavelength. For example, the second mirror structure is a Bragg mirror comprising a plurality of alternating first and second layers. The first layers of the first mirror structure and the first layers of the second mirror structure may each be formed from a radiation-transmissive and electrically conductive material, in particular from the same material. However, the second layers of the first mirror structure and the second layers of the second mirror structure may differ from each other with respect to their layer thicknesses and/or their materials.

The radiation-transmissive and electrically conductive material of the first transition zone and/or of the second transition zone may be a transparent electrically conductive oxide (TCO), in particular indium tin oxide (ITO). The radiation-transmissive and electrically conductive material has a refractive index different from a refractive index of the first and/or second and/or third semiconductor bodies preferably by at least 0.2, for instance by at least 0.4 or 0.6. In case of doubt, the corresponding refractive indices are determined at a wavelength in the red, green or blue spectral range, for example, at about 550 nm.

The first transition zone and/or the second transition zone may be free of an adhesion-promoting bonding material and/or of a bonding layer. The semiconductor bodies of the component can be mechanically and electrically connected to each other by direct bonding. The first transition zone and/or the second transition zone may have an internal planar interface between a first terminal layer and a second terminal layer. Preferably, the first terminal layer and/or the second terminal layer are/is formed from the radiation-transmissive and electrically conductive material. In direct bonding, the inner interface is in particular free of a bonding material, in particular free of an adhesion-promoting bonding material such as a solder material or an adhesive. The inner interface surface is formed for instance by planar connecting surfaces of the terminal layers. The first and second terminal layers can be formed from the same material or different radiation-transmissive and electrically conductive materials. The first transition zone and/or the second transition zone may have a plurality of such internal planar interfaces, in particular at least two of such internal planar interfaces, and may be free of an adhesion-promoting bonding material.

In our method of producing a component, a first composite such as a first wafer composite is provided which comprises a substrate, a first semiconductor body and a first terminal layer. The first composite has a first exposed planar connecting surface. The planar connecting surface is formed for instance by a surface of the first terminal layer. The first semiconductor body is located between the substrate and the first planar connecting surface and has a first optically active layer. The substrate can be a growth substrate such as a sapphire substrate or a silicon substrate. Alternatively, the substrate may be different from a growth substrate.

A planar connecting surface generally means a surface that is in particular microscopically flat. Preferably, the planar surface shows a local vertical roughness that is especially smaller than 5 nm, smaller than 3 nm, preferably smaller than 1 nm or smaller than 0.5 nm. In case of doubt, the roughness is determined as the root mean square (RMS).

A second composite, in particular a second wafer composite, has an auxiliary substrate, a second semiconductor body and a second terminal layer. The second composite has a second planar connecting surface formed in particular by a surface of the second terminal layer. The second semiconductor body is located between the auxiliary substrate and the second planar connecting surface and has a second optically active layer. The first terminal layer and the second terminal layer are preferably formed from a radiation-transmissive and electrically conductive material. They can be formed from the same material or different materials.

The first composite and the second composite preferably mechanically and electrically connect to each other by direct bonding at the first and second planar connecting surfaces. A first transition zone is formed between the first semiconductor body and the second semiconductor body, wherein the transition zone comprises the first and second terminal layers. The first and second composites are preferably formed such that the transition zone has a structured main surface and/or a partially transparent and partially wavelength-selectively reflective first mirror structure. In a subsequent method step, the auxiliary substrate is separated from the second composite. The auxiliary substrate can be a growth substrate on which the second semiconductor body has been grown epitaxially, or it can be different from a growth substrate.

Direct bonding brings hydrophilic and hydrophobic surfaces into physical contact. The mechanical bond is predominantly or exclusively based on hydrogen bonds and/or van-der-Waals interactions in the immediate vicinity of a common interface. In a direct-bonding process, under the influence of pressure and suitable temperature, the first and second planar connecting surfaces can be brought together to form a common composite for instance from the first and second composites such that the common interface is formed by immediately adjacent regions of the first and second connecting surfaces and remains free from a bonding material, in particular from an adhesion-promoting material.

The auxiliary substrate may have a structured main surface on which the second semiconductor body is grown. In particular, the auxiliary substrate is a structured sapphire substrate. After detachment or separation of the auxiliary substrate, the structure of the main surface of the auxiliary substrate is transferred to a surface of the second semiconductor body as an inverted structure of the main surface of the auxiliary substrate. Thus, after separating the auxiliary substrate, the second semiconductor body has an exposed structured main surface.

The second semiconductor body may be grown on the auxiliary substrate, wherein an exposed main surface of the second semiconductor body is structured before a terminal layer made from a radiation-transmissive and electrically conductive material is formed on the exposed and structured main surface of the second semiconductor body. The structuring of the exposed main surface of the second semiconductor body can be carried out before or after separation of the auxiliary substrate.

The first mirror structure may be mechanically bonded to the first semiconductor body by direct bonding, before the first composite is mechanically and electrically bonded to the second composite by direct bonding. In particular, the first mirror structure may be formed on another auxiliary substrate. The first mirror structure and the further auxiliary substrate can be bonded to the first semiconductor body by direct bonding, whereupon the further auxiliary substrate is removed. In variation from this, the first mirror structure may be applied directly onto the first or second composite by an alternative process such as by a coating process before the first and second composites are bonded together by direct bonding.

The method described above is particularly suitable for the production of a component described above. The features described in connection with the component can therefore also be used for the method and vice versa.

Further advantages, preferred examples and further structures of the component and of the method will become apparent from the examples explained in the following in connection with FIGS. 1A to 7.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

An examples of a method of producing a component is shown schematically in FIGS. 1A to 1G.

FIG. 1A shows a first composite 20 comprising a substrate 1, a first semiconductor body 2 arranged thereon and a first terminal layer 31. The substrate 1 can be a growth substrate on which the first semiconductor body 2 has been grown epitaxially. For example, the substrate 1 is a silicon or a sapphire substrate such as a GaAs substrate. Alternatively, the substrate 1 may be a carrier other than a growth substrate.

The first semiconductor body 2 comprises a first semiconductor layer 21 facing towards the substrate 1, a second semiconductor layer 22 and an optically active layer 23 disposed between the semiconductor layers. The semiconductor layers 21 and 22 can be n- or p-conducting and can also be n- or p-doped. In particular, the semiconductor layers 21 and/or 22 can be formed from several semiconductor sublayers of different material compositions arranged one above the other in the vertical direction. The active layer 23 is configured to generate electromagnetic radiation of the first peak wavelength. Preferably, the first semiconductor body 2 comprises or consists of a III-V or II-VI semiconductor compound material.

The semiconductor body has a flat first main surface 201 and faces towards the substrate 1. The first semiconductor body 2 has a second main surface 202 that is structured and faces away from the substrate 1. The second main surface 202 is formed in particular by a surface of the second semiconductor layer 22. The first terminal layer 31 in particular directly adjoins the first semiconductor body 2 and has a first main surface 301 that is also structured and faces towards the semiconductor body 2. In particular, the first main surface 301 of the first terminal layer 31 and the second main surface 202 of the first semiconductor body 2 form a common structured interface.

The first composite 20 has an exposed planar first connecting surface 311 formed in particular by a surface of the first terminal layer 31 facing away from the first semiconductor body 2. The first terminal layer 31 is preferably formed from a radiation-transmissive and electrically conductive material such as from a transparent and electrically conductive oxide (TCO).

The substrate 1 has a first main surface 11 facing the first semiconductor body 2 and a second main surface 12 facing away from the first semiconductor body 2, wherein the main surfaces of the substrate 1 are flat. The first main surface 201 of the first semiconductor body 2 is also flat. The second main surface 202 can be generated by structuring, for example, by so-called sphere-fishing, wherein a surface of the first semiconductor body 2 is structured, for instance roughened. Without a photoresist, this can be carried out dry-chemically using small spheres especially in the nanometer range, wherein the spheres are applied to the second main surface 202 and then etched away so that decoupling structures are generated on the second main surface 202 in the form of elevations or depressions in the nanometer range. Such spheres may have a diameter of for instance 50 nm to 2 µm or 50 nm to 1 µm.

Preferably after structuring, the first terminal layer 31 is applied directly onto the second main surface 202 so that the first terminal layer 31 has a first main surface 301 facing the semiconductor body 2 and has an inverted structure of the second main surface 202 of the first semiconductor body 2. The first terminal layer 31 can be applied directly onto the first semiconductor body 2 by a coating process, wherein the first terminal layer 31 can then be polished, for example, by chemical-mechanical planarization, to form the first planar connecting surface 311. According to FIG. 1B, a second composite 40 having an auxiliary substrate 9, a second semiconductor body 4 arranged thereon and a second terminal layer 32 is provided. The auxiliary substrate 9 is in particular a growth substrate having a structured main surface 91. In particular, the auxiliary substrate 9 is a patterned sapphire substrate (PSS).

The semiconductor body 4 comprising a first semiconductor layer 41, a second semiconductor layer 42 and a second active layer 43 can be epitaxially applied onto the structured main surface 91 so that the second semiconductor body 4 also has a structured main surface 402 facing the auxiliary substrate 9. The second active layer 43 is configured to generate electromagnetic radiation of a second peak wavelength. Structurally, the second body 4 can be similar to the first semiconductor body 2. The second semiconductor body 4 has a first main surface 401 facing the second terminal layer 32. The first main surface 401 is flat. Deviating from FIG. 1B, the first main surface 401 of the second semiconductor body 4 may be structured. The second composite 40 has a second planar connecting surface 321 formed in particular by an exposed surface of the second terminal layer 32. The second terminal layer preferably comprises or consists of a radiation-transmissive and electrically conductive material. The first terminal layer 31 of the first composite 20 and the second terminal layer 32 of the second composite 40 may be formed from the same material or have different material compositions.

Figure 1B:
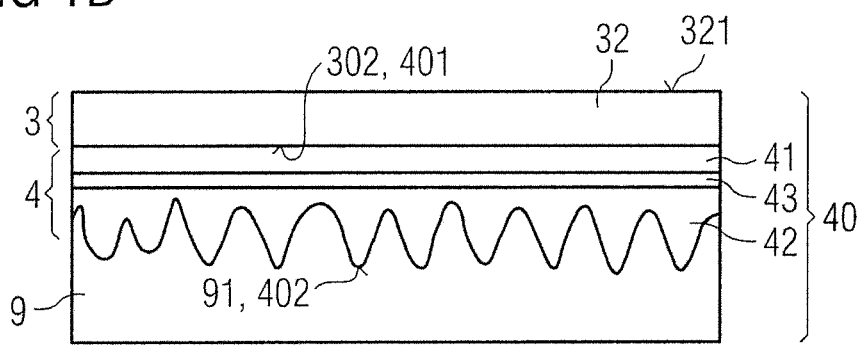
Figure 1C:
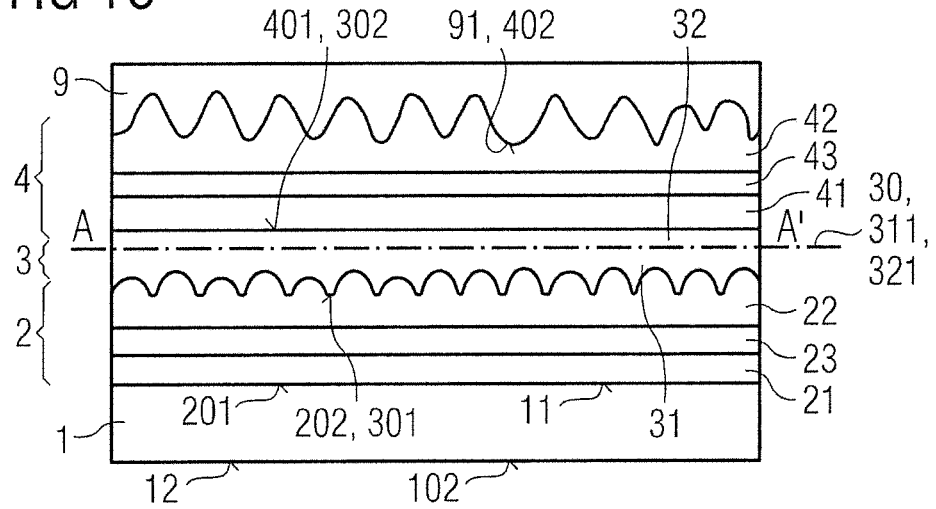

According to FIG. 1C, the first composite 20 mechanically and electrically connects to the second composite 40 at the first and second planar connecting surfaces 311 and 321 by direct bonding. A first transition zone 3 is formed and comprises the first terminal layer 31 and the second terminal layer 32. The first transition zone 3 thus has a structured first main surface 301 facing the first semiconductor body 2. Within the first transition zone 3, the first planar connecting surface 311 and the second planar connecting surface 321 are directly adjacent to each other and define an inner common planar interface 30 between the first composite 20 and the second composite 40. Due to direct bonding, the inner common planar interface 30 between the first terminal layer 31 and the second terminal layer 32 is free of a bonding material. In FIG. 1C, the common interface surface 30 is represented by a dashed line AA'. The first transition zone 3 in particular directly adjoins the first semiconductor body 2 and directly adjoins the second semiconductor body 4 and is in particular free of an adhesion-promoting bonding material or an adhesion-promoting bonding layer. If the first terminal layer 31 and the second terminal layer 32 are formed from the same material, which is in particular radiation-transmissive and electrically conductive, the first transition zone 3 can be formed continuously from a single material along the vertical direction.

Figure 1D:
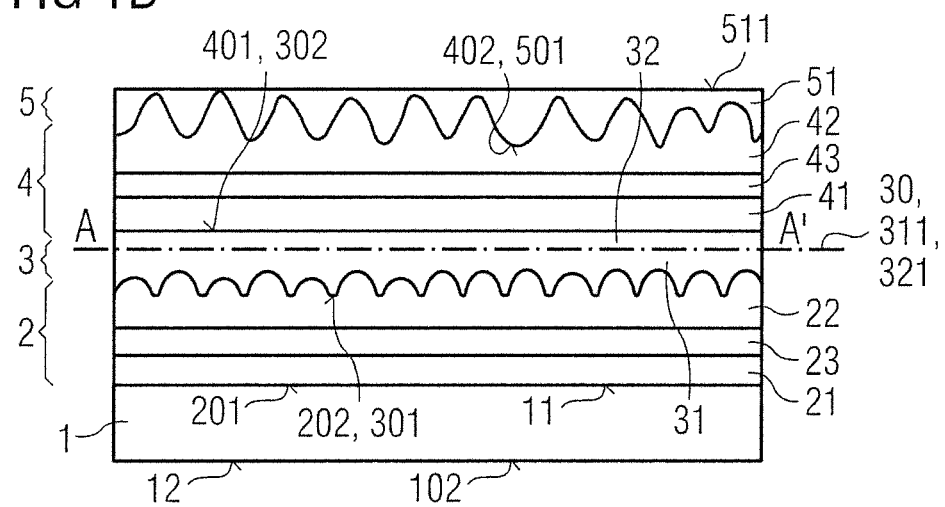

In FIG. 1D, the auxiliary substrate 9 is detached from the second semiconductor body 4. The semiconductor body 4 has structured a second main surface 402 and faces away from the first semiconductor body 2. In a further method step, a first terminal layer 51 of a second transition zone 5 is applied onto the second semiconductor body 4, in particular onto the structured exposed second main surface 402 of the second semiconductor body, for instance by a coating process. The first terminal layer 51 may have a radiation-transmissive and electrically conductive material, for instance the same material as the first transition zone 3. The first terminal layer 51 of the second transition zone 5 is preferably applied onto the structured second main surface 402 such that the first terminal layer 51 has a structured first main surface 501 facing the second semiconductor body 4. The first terminal layer 51 can subsequently be planarized such that it has an exposed planar further first connecting surface 511 facing away from the second semiconductor body 4.

Figure 1E:
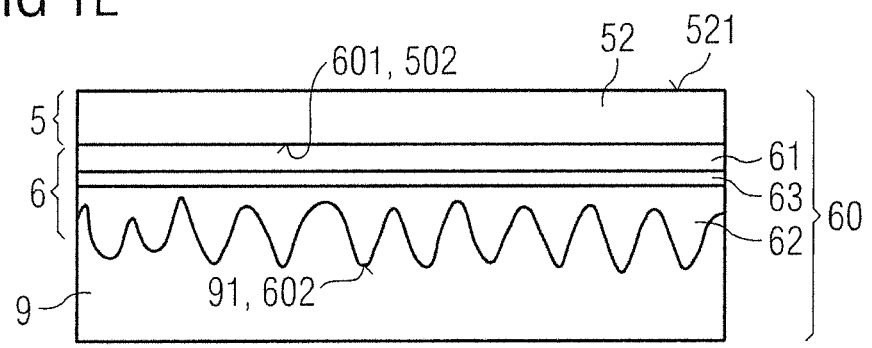

FIG. 1E shows a third composite 60 comprising a further auxiliary substrate 9, a third semiconductor body 6 and a further second terminal layer 52, wherein the third composite 60 has a further exposed planar second connecting surface 521 formed by a surface of the further second terminal layer 52 of the second transition zone 5. The third semiconductor body 6 comprises a first semiconductor layer 61, a second semiconductor layer 62 and an optically active layer 63 arranged therebetween, wherein the active layer 63 is configured to generate electromagnetic radiation of a third peak wavelength. The third composite 60 essentially corresponds to the example of the second composite 40 shown in FIG. 1B.

In FIG. 1F, the third composite 60 mechanically and electrically connects to the second semiconductor body 4 preferably by direct bonding at the further planar connecting surfaces 511 and 521. A second transition zone 5 is formed between the second semiconductor body 4 and the third semiconductor body 6, wherein the second transition zone 5 in particular directly adjoins both the second semiconductor body 4 and the third semiconductor body 6. The component to be manufactured is thus for instance free of an adhesion-promoting material or a bonding layer in the region between the second transition zone 5 and the second semiconductor body 4 or the third semiconductor body 6.

The second transition zone 5 comprises the further first terminal layer 51 and the further second terminal layer 52. Along the vertical direction, the second transition zone 5 can be formed continuously from the radiation-transmissive and electrically conductive material. Analogous to the first transition zone 3, the second transition zone 5 may have inner common planar interfaces 50 formed by the further first planar connecting surface 511 and the further second planar connecting surface 521. The inner interface surface 50, shown in FIG. 1F by the dashed line BB', is in particular free of a bonding material. The inner interface 50 thus forms a common interface between the further first terminal layer 51 and the further second terminal layer 52. The second transition zone 5 has a first main surface 501 formed in a structured manner and faces the second semiconductor body 4. The structuring of the first main surface 501 of the second transition zone 5 is given in particular by the structuring of the second main surface 402 of the second semiconductor body 4.

The third semiconductor body 6 has a first main surface 601 facing the second transition zone 5 and directly adjoins a second main surface 502 of the second transition zone 5. The main surfaces 502 and 601 are flat according to FIG. 1F. Deviating from this, they can also be structured. The semiconductor body 6 has a second structured main surface 602 and faces away from the second semiconductor body 4. In particular, the structuring of the second main surface 602 is given by the structuring of the auxiliary substrate 9.

FIG. 1G shows a component 100 that can be manufactured according to the method shown in FIGS. 1A to 1F. The further auxiliary substrate 9 is removed from the third semiconductor body 6. A cover layer 7 can be formed on the second main surface 602 which has become exposed as a result, wherein the cover layer 7 can serve as a contact layer or as a protective layer. In particular, the cover layer 7 may have a radiation-transmissive and electrically conductive material. The component 100 has a front side 101 formed in particular by a main surface 71 of the cover layer 7. The front side 101 forms in particular a radiation exit surface of the component 100. The component 100 has a rear side 102 formed in particular by a second main surface 12 of the substrate 1.

The first semiconductor body 2, the second semiconductor body 4 and the third semiconductor body 6 each have an optically active layer arranged between two semiconductor layers. In particular, semiconductor bodies 2, 4 and 6 electrically connect in series. The first semiconductor layers 21, 41 and 61 may have the same material composition and at the same time be n- or p-conductive and/or doped. Similarly, the second semiconductor layers 22, 42 and 62 may have the same material composition and at the same time be n- or p-conductive and/or doped. The first active layer 23, the second active layer 43 and the third active layer 63 can be formed such that they emit electromagnetic radiations of the same peak wavelength or different peak wavelengths when the component 100 is in operation.

For example, the active layers 23, 43 and 63 can emit electromagnetic radiation with a peak wavelength in the red or green or yellow or blue spectral range. Alternatively, the active layers may be formed such that they emit electromagnetic radiations of different peak wavelengths during operation of the component 100, wherein the different peak wavelengths differ from each other by at least 30 nm, for instance by at least 50 nm or for instance by at least 70 nm. For example, the first active layer 23 is formed to generate electromagnetic radiation having a first peak wavelength in the red spectral range, for instance between 600 nm and 780 nm. The second active layer 43 is formed to generate electromagnetic radiation, for example, with a second peak wavelength in the green spectral range, for instance between 490 nm and 570 nm. The third active layer 63 is formed for the generation of electromagnetic radiation preferably with a third peak wavelength in the blue spectral range, for instance between 430 nm and 490 nm. Preferably, the component 100 is configured such that the second active layer 43 is disposed between the first active layer 23 and the third active layer 63, wherein the third active layer is closest to the radiation exit surface 101 of the component and the first active layer 23 is closest to the substrate 1.

The structured main surfaces of the first transition zone 3 and of the second transition zone 5 may have decoupling structures of different sizes. Preferably, the structured main surface 301 or 302 of the first transition zone 3 has first decoupling structures having larger lateral widths compared to the second decoupling structures of the structured main surface 501 or 502 of the second transition zone 5. Preferably, the decoupling structures of the first transition zone 3 have an average lateral width smaller than the peak wavelength of the radiation generated in the first active layer 23 and at the same time is larger than the second peak wavelength of the radiation generated in the second active layer 43. The second decoupling structures of the second transition zone 5 preferably have an average lateral width smaller than the peak wavelengths of the radiation generated in the first and/or second active layer(s) and at the same time larger than the third peak wavelength of the radiation generated in the third active layer 63. By such a design of the component, longer wavelength radiations in the direction of the radiation exit surface 101 are transmitted substantially in an unhindered manner and thus substantially without losses through the transition zones 3 and 5, while shorter wavelength radiations are scattered at the decoupling structures in the transition zones 3 and/or 5 or, at least compared to the longer wavelength radiations, are scattered more strongly and thus are deflected or reflected back in the direction of the radiation exit surface 101.

FIGS. 2A to 2D show a further example of a method of producing a component 100.

Figure 2A:
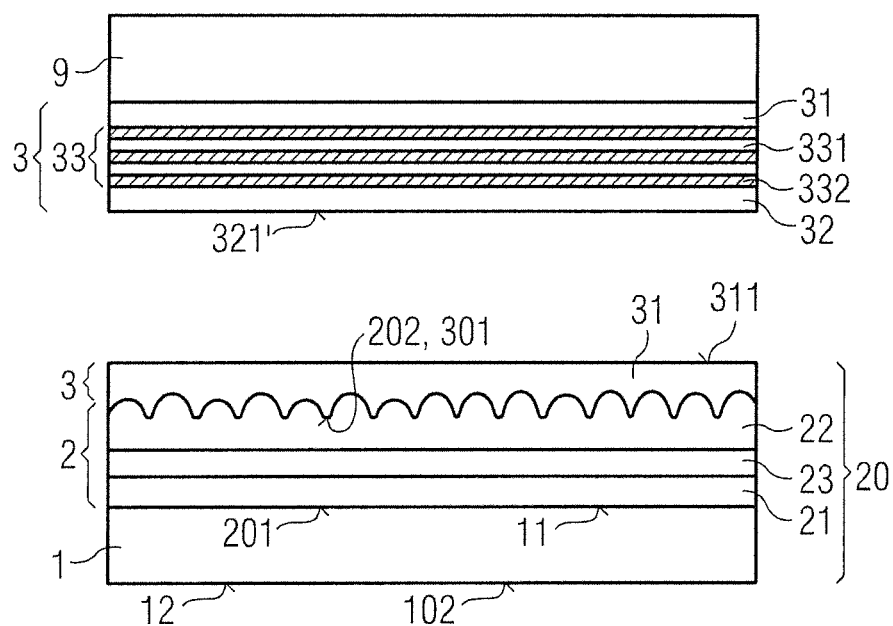
FIGS. 2A, 2B, 2C and 2D show schematic illustrations of different method steps of producing a component according to a further example.

The first composite 20 shown in FIG. 2A corresponds to the first composite 20 shown in FIG. 1A. Before connecting the first composite 20 to the second composite 40, a first mirror structure 33 is applied to the first semiconductor body 2. The first mirror structure 33 is especially formed as part of the first transition zone 3. For example, the first mirror structure 33 may initially be formed on an auxiliary substrate 9. On the mirror structure 33, in particular, there is a terminal layer 32 formed from an electrically conductive and radiation-transmissive material. The terminal layer has an exposed surface 321' especially formed as a planar connecting surface 321'. The first mirror structure 33 arranged on the auxiliary substrate 9 can be mechanically and especially electrically connected to the first composite 20, e.g., to the first terminal layer 31 or to the first semiconductor body 2, by direct bonding. Alternatively, the first mirror structure 33 can be applied directly onto the semiconductor body 2 using a coating process.

Figure 2B:
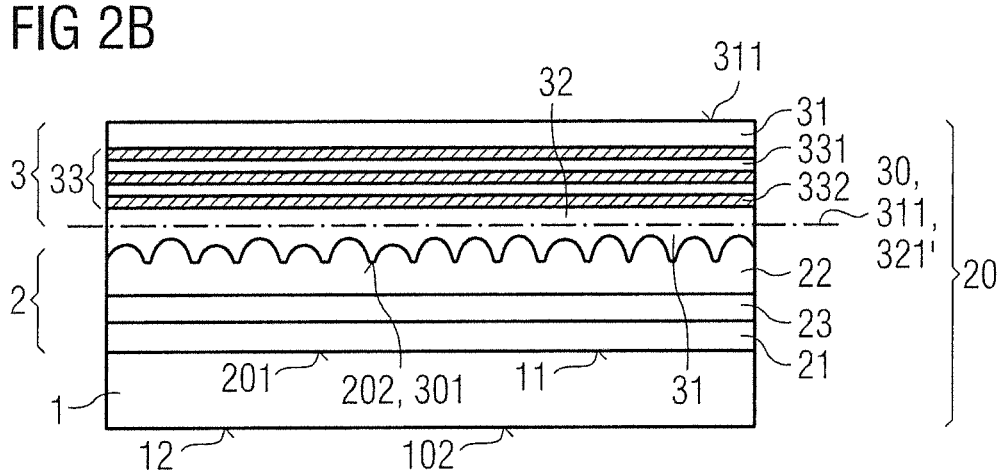

In FIG. 2B, the auxiliary substrate 9 is removed from the first mirror structure 33. The first transition zone 3 has an inner interface surface 30 that is particularly planar and formed by the first connecting surface 311 and the connecting surface 321' of the first mirror structure 33. After removing the auxiliary substrate 9 on which the first mirror structure 33 is arranged, an exposed surface 311 of the first transition zone 3, in particular an exposed surface 311 of a first terminal layer 31 can be planarized.

Preferably, the first mirror structure 33 is partially transparent and partially wavelength-selectively reflective. For example, the first mirror structure 33 has alternating first layers 331 and second layers 332. The first layers 331 and the second layers 332 may be formed from materials of different refractive indices. For example, the first layers 331 have a refractive index that differs from a refractive index of the second layers 332 by at least 0.3, for instance by at least 0.5 or 0.7. For example, the first layers 331 and/or the second layers 332 are each formed from a radiation-transmissive and electrically conductive material.

Figure 2C:
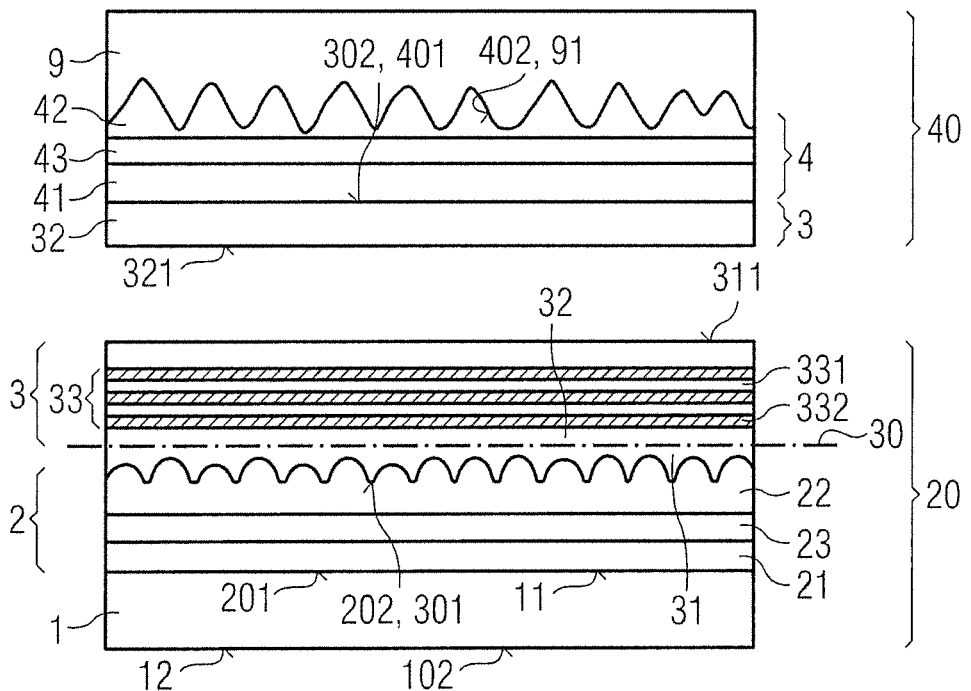

The example of a method step shown in FIG. 2C essentially corresponds to the example of a method step shown in FIGS. 1B and 1C. In contrast, the first composite 20 has a first semiconductor body 2 and a first mirror structure 33 disposed thereon, wherein along the vertical direction the first mirror structure 33 is between the first semiconductor body 2 and the first exposed planar connecting surface 311.

Figure 2D:
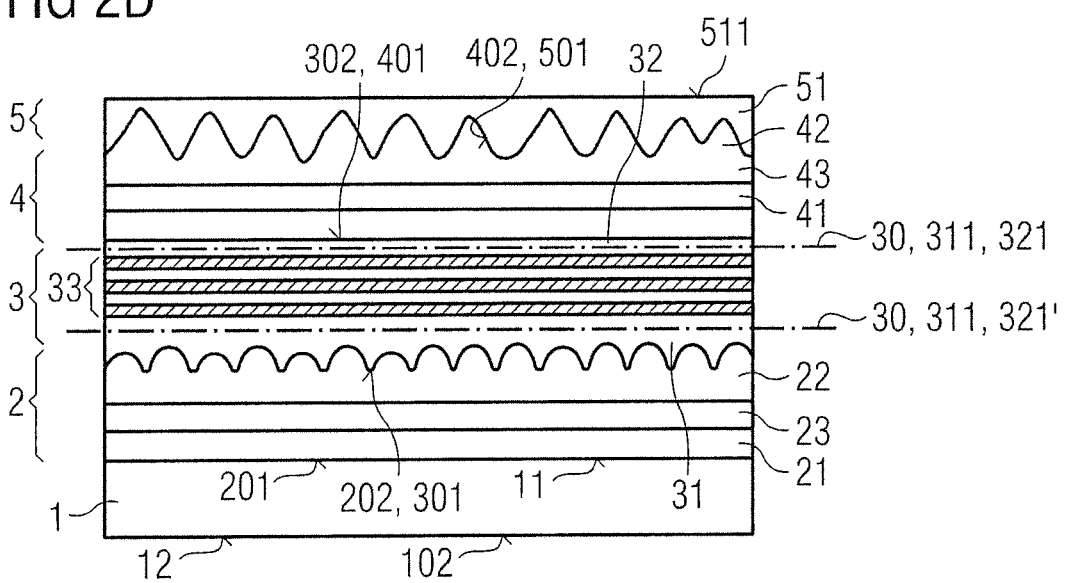

The method step shown in FIG. 2D essentially corresponds to the method step shown in FIG. 1D of a method of producing a component. In contrast to this, in addition to the structured main surface 301, the first transition zone 3 shows the first partially transparent and partially wavelength-selectively reflective mirror structure 33.

Figure 3:
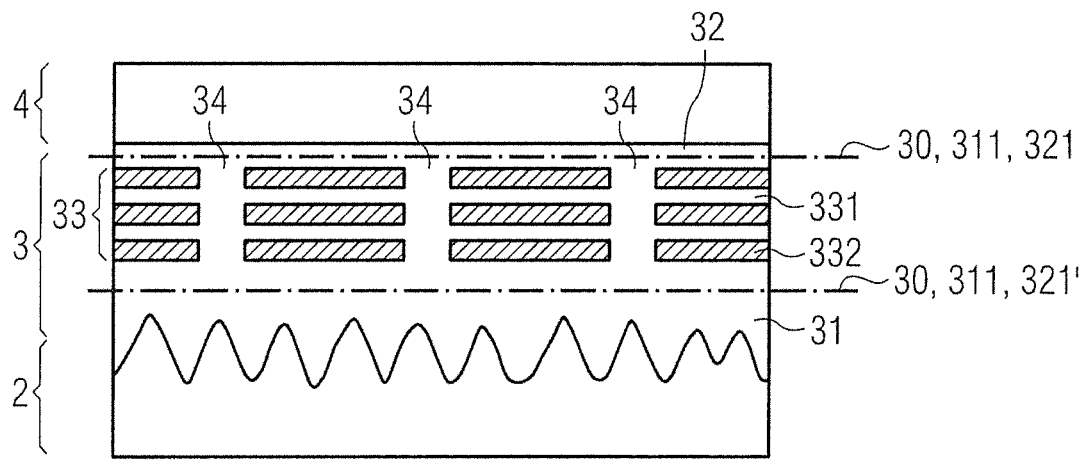
FIGS. 3, 4A and 4B show schematic illustrations of some method steps of producing a component according to a further example.

FIG. 3 schematically shows a section of the first transition zone 3 between the first semiconductor body 2 and the second semiconductor body 4. According to this example, the first mirror structure 33 has a plurality of through-contacts 34 extending vertically throughout the first layers 331 and the second layers 332. The through-contacts 34 are preferably formed from an electrically conductive material. In particular, the through-contacts 34 are formed from an electrically conductive and radiation-transmissive material.

Figure 4A:
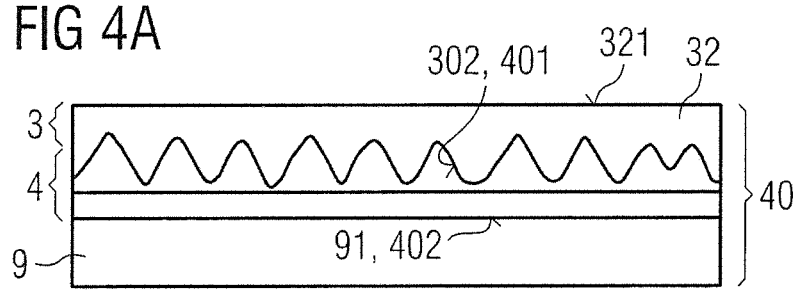

The second composite 40 shown in FIG. 4A essentially corresponds to the second composite 40 shown in FIG. 1B. In contrast to this, the auxiliary substrate 9 does not have a structured main surface 91, but a flat main surface 91. The second semiconductor body 4 has a first structured main surface 401 and faces away from the auxiliary substrate 9. The first main surface 401 can be roughened after application of the second semiconductor body 4 on the auxiliary substrate 9, e.g., by an etching process or so-called sphere-fishing.

Figure 4B:
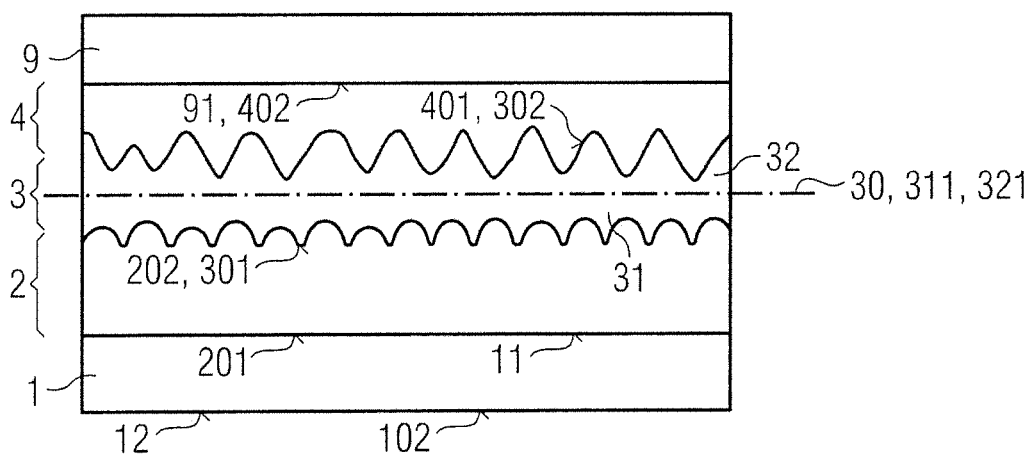

The example shown in FIG. 4B essentially corresponds to the example shown in FIG. 1C for a method step in the manufacture of a component. In contrast, the second semiconductor body 4 has a structured first main surface 401 facing the first semiconductor body 2. The first transition zone 3 thus has both a first structured main surface 301 facing the first semiconductor body 2 and a second structured main surface 302 facing the second semiconductor body 4. The third composite 60 having the third semiconductor body 6 and the second transition zone 5 can be formed analogously to the examples shown in FIGS. 4A and 4B. A second transition zone 5, in particular comprising a second mirror structure 53, can also be formed analogously to the method steps described in FIGS. 2A to 2D and 3.

FIG. 5 shows an example of a component 100 essentially corresponding to the example of a component 100 shown in FIG. 1G. In contrast, the component 100 has an intermediate layer 10 arranged vertically between the substrate 1 and the first semiconductor body 2. The intermediate layer 10 is preferably formed as a mirror layer that can contain a metallic material such as silver or aluminum. In particular, the substrate 1 is different from a growth substrate. The substrate 1 may be formed from an electrically conductive material. The component 100 can be externally electrically contacted via the front side 101 and via the rear side 102. The component 100 can thus be electrically contacted via the substrate 1, in particular via the rear side 12 of the substrate 1.

The example of a component 100 shown in FIG. 6 essentially corresponds to the example of a component shown in FIG. 5. In contrast, the semiconductor bodies 2, 4 and 6 each have a first structured main surface 201, 401 and 601 facing the substrate 1. Thus, the transition zones 3 and 5 each have a second structured main surface 302 and 502 facing the radiation exit surface 101. The intermediate layer 10 has a structured main surface facing the first semiconductor body 2. The intermediate layer 10 can serve as a buffer layer between the substrate 1 and the first semiconductor body 2.

The example of a component 100 shown in FIG. 7 essentially corresponds to the example of a component shown in FIG. 5. In contrast, the transition zones 3 and 5 each have a mirror structure 33 or 53. The first mirror structure 33 of the first transition zone 3 and the second mirror structure 53 of the second transition zone 5 can structurally be alike. In particular, the transition zones 3 and 5 can be produced according to the method steps shown in FIGS. 2A to 2D.

The first mirror structure 33 and/or the second mirror structure 53 can be formed such that they act/it acts as a Bragg mirror, in particular as a dichroic mirror. Analogous to the first mirror structure 33, the second mirror structure 53 may comprise a plurality of alternately arranged first layers 531 and second layers 532. For example, the second mirror structure 53 is partially transparent and partially wavelength-selectively reflective, wherein the second mirror structure 53 may differ from the first mirror structure 33 in its wavelength selectivity. Preferably, the first mirror structure 33 is formed such that it transmits electromagnetic radiation of the first peak wavelength and scatters and/or reflects electromagnetic radiation of the second peak wavelength. The second mirror structure 53 is preferably formed such that it transmits electromagnetic radiation of the first and/or second peak wavelength(s) and scatters and/or reflects electromagnetic radiation of the third peak wavelength.

Analogous to the first mirror structure 33, the second mirror structure 53 can mechanically and electrically connect to the second semiconductor body 4 by direct bonding. The third semiconductor body 6 can also mechanically and electrically connect to the second mirror structure 53 or to the second semiconductor body 4 by direct bonding. Thus, the second transition zone may have common inner planar interfaces 50 formed by further planar connecting surfaces 511 and 521 or 511 and 521', wherein the inner planar interfaces 50 are in particular free of an adhesion-promoting material. The further planar connecting surfaces 511 and 521 are formed in particular by surfaces of the first terminal layer 51 and of the second terminal layer 52 of the second transition zone 5, respectively. The terminal layers 51 and 52 of the second transition zone 5 can be formed from a radiation-transmissive and electrically conductive material.

The component described here is formed in particular as an optoelectronic component having a plurality of semiconductor bodies stacked on top of each other. The semiconductor bodies stacked on top of each other can be produced separately in different method steps and each have a diode structure comprising an optically active layer. If a transition zone is formed between the semiconductor bodies, wherein the transition zone has a structured main surface or a partially transparent and partially wavelength-selectively reflective mirror structure, the efficiency of the component can be enhanced.

The priority of DE 10 2016 113 002.8 is claimed, the subject matter of which is incorporated herein by reference.

Our components and methods are not restricted to the examples by the description made with reference to examples. This disclosure rather comprises any novel feature and any combination of features, including in particular any combination of features in the appended claims, even if the feature or combination is not itself explicitly indicated in the claims or examples.

The invention claimed is:

1. A component comprising a substrate, a first semiconductor body having a first active layer, a second semiconductor body having a second active layer, and a first transition zone, wherein
the first active layer is configured to generate electromagnetic radiation of a first peak wavelength and the second active layer is configured to generate electromagnetic radiation of a second peak wavelength,
in the vertical direction, the first transition zone is arranged between the first semiconductor body and the second semiconductor body and is directly adjacent to the first semiconductor body and directly adjacent to the second semiconductor body,
the first transition zone comprises a radiation-transmissive, at least for the radiation of the first peak wavelength partially transparent and electrically conductive material so that the first semiconductor body electrically conductively connects to the second semiconductor body via the first transition zone, and
the first transition zone comprises a first partially transparent and partially wavelength-selectively reflective mirror structure, wherein
the first mirror structure comprises alternately disposed first layers and second layers,
the first layers are formed from a radiation-transmissive and electrically conductive material, and
the first mirror structure has a plurality of through-contacts extending vertically throughout the first layers and the second layers, the through-contacts being formed from an electrically conductive material.

2. The component according to claim 1, wherein the first transition zone is free of an adhesion-promoting material or free of a bonding layer.

3. The component according to claim 1, wherein the first transition zone has an inner planar interface between a first terminal layer and a second terminal layer, and
the first terminal layer and/or the second terminal layer of the first transition zone are/is formed from the radiation-transmissive and electrically conductive material, and
the inner interface surface is free of a bonding material and formed by planar connecting surfaces of the terminal layers.

4. The component according to claim 1, wherein the first transition zone comprises a first terminal layer and further comprises a structured main surface having first decoupling structures, and the first terminal layer is applied directly onto a structured main surface of the first semiconductor body so that the first terminal layer has the main surface facing the first semiconductor body and has an inverted structure of the main surface of the first semiconductor body.

5. The component according to claim 1, wherein the first mirror structure is formed such that it acts as a dichroic mirror transmitting electromagnetic radiation of the first peak wavelength and scatters or reflects electromagnetic radiation of the second peak wavelength.

6. The component according to claim 1, wherein the first layers have a refractive index that differs from a refractive index of the second layers by at least 0.3.

7. The component according to claim 1, further comprising a third semiconductor body comprising a third optically active layer that generates electromagnetic radiation of a third peak wavelength, wherein the second semiconductor body is arranged between the first semiconductor body and the third semiconductor body, and the second semiconductor body mechanically and electrically connects to the third semiconductor body via a second transition zone.

8. A component comprising a substrate, a first semiconductor body having a first active layer, a second semiconductor body having a second active layer, and a first transition zone, wherein
the first active layer is configured to generate electromagnetic radiation of a first peak wavelength and the second active layer is configured to generate electromagnetic radiation of a second peak wavelength,
in the vertical direction, the first transition zone is arranged between the first semiconductor body and the second semiconductor body and is directly adjacent to the first semiconductor body and directly adjacent to the second semiconductor body,
the first transition zone comprises a radiation-transmissive, at least for the radiation of the first peak wavelength partially transparent and electrically conductive material so that the first semiconductor body electrically conductively connects to the second semiconductor body via the first transition zone, and
the first transition zone comprises a structured main surface or a first partially transparent and partially wavelength-selectively reflective mirror structure,
wherein the component further comprises a third semiconductor body comprising a third optically active layer that generates electromagnetic radiation of a third peak wavelength, the second semiconductor body is arranged between the first semiconductor body and the third semiconductor body, the second semiconductor body mechanically and electrically connects to the third semiconductor body via a second transition zone, and the second transition zone comprises a structured main surface having second decoupling structures, and the second decoupling structures have an average lateral width less than the second peak wavelength and greater than the third peak wavelength.

9. The component according to claim 8, wherein the second transition zone has a second mirror structure that is partially transparent and partially wavelength-selectively reflective and transmits electromagnetic radiation of the first and second peak wavelengths and scatters or at least partially reflects electromagnetic radiation of the third peak wavelengths.

10. A component comprising a substrate, a first semiconductor body having a first active layer, a second semiconductor body having a second active layer, and a first transition zone, wherein the first active layer is configured to generate electromagnetic radiation of a first peak wavelength and the second active layer is configured to generate electromagnetic radiation of a second peak wavelength, in the vertical direction, the first transition zone is arranged between the first semiconductor body and the second semiconductor body and is directly adjacent to the first semiconductor body and directly adjacent to the second semiconductor body, the first transition zone comprises a radiation-transmissive, at least for the radiation of the first peak wavelength partially transparent and electrically conductive material so that the first semiconductor body electrically conductively connects to the second semiconductor body via the first transition zone, and the first transition zone comprises a structured main surface having first decoupling structures, wherein the component further comprises a third semiconductor body comprising a third optically active layer that generates electromagnetic radiation of a third peak wavelength, the second semiconductor body is arranged between the first semiconductor body and the third semiconductor body, the second semiconductor body mechanically and electrically connects to the third semiconductor body via a second transition zone, the first peak wavelength is assigned to a red spectral range, the second peak wavelength is assigned to a green spectral range, the third peak wavelength is assigned to a blue spectral range, and the second transition zone has a structured main surface comprising second decoupling structures having smaller lateral widths compared to the first decoupling structures of the structured main surface of the first transition zone.

11. The component according to claim 8, wherein the first transition zone comprises the first partially transparent and partially wavelength-selectively reflective mirror structure, the second transition zone has a second partially transparent and partially wavelength-selectively reflective mirror structure, and regarding the wavelength selectivity, the second mirror structure is different from the first mirror structure.

12. The component according to claim 11, wherein the first mirror structure and the second mirror structure are each formed as Bragg mirrors comprising a plurality of alternately disposed first layers and second layers, and the first layers of the first mirror structure and the first layers of the second mirror structure are each formed from a radiation-transmissive and electrically conductive material, and the second layers of the first mirror structure and the second layers of the second mirror structure differ from each other with respect to their layer thicknesses and/or their materials.

13. The component according to claim 1, wherein the radiation-transmissive and electrically conductive material of the transition zone is a transparent electrically conductive oxide.

14. The component according to claim 1, wherein the first mirror structure is formed such that it transmits electromagnetic radiation of the first peak wavelength and scatters or partially reflects electromagnetic radiation of the second peak wavelength.

* * * * *